(12) United States Patent
Simor et al.

(10) Patent No.: US 8,337,957 B2
(45) Date of Patent: *Dec. 25, 2012

(54) METHOD FOR DEPOSITING A POLYMER LAYER CONTAINING NANOMATERIAL ON A SUBSTRATE MATERIAL AND APPARATUS

(75) Inventors: Marcel Simor, Zoelermeer (NL); Ales Fiala, Rotterdam (NL)

(73) Assignee: Nederlandse Organisatie Voor Toegepast-Natuurwetenschappelijk Onderzoek TNO, Delft (NL)

( * ) Notice: Subject to any disclaimer, the term of this patent is extended or adjusted under 35 U.S.C. 154(b) by 911 days.

This patent is subject to a terminal disclaimer.

(21) Appl. No.: 11/994,431

(22) PCT Filed: Jul. 7, 2006

(86) PCT No.: PCT/NL2006/000344
§ 371 (c)(1),
(2), (4) Date: Apr. 24, 2008

(87) PCT Pub. No.: WO2007/008063
PCT Pub. Date: Jan. 18, 2007

(65) Prior Publication Data
US 2008/0199629 A1    Aug. 21, 2008

(30) Foreign Application Priority Data
Jul. 8, 2005 (EP) .................................. 05076567

(51) Int. Cl.
*H05H 1/24* (2006.01)
*C08F 2/58* (2006.01)

(52) U.S. Cl. .................................. 427/488; 427/491

(58) Field of Classification Search ............ 427/488, 427/491
See application file for complete search history.

(56) References Cited

U.S. PATENT DOCUMENTS

| | | | |
|---|---|---|---|
| 5,674,621 A * | 10/1997 | Visser et al. ............... 428/408 |
| 5,792,517 A | 8/1998 | Takeuchi et al. |
| 6,235,351 B1 | 5/2001 | DiMarzio et al. |
| 6,277,448 B2 | 8/2001 | Strutt et al. |
| 6,607,994 B2 | 8/2003 | Soane et al. |
| 6,616,987 B1 | 9/2003 | Morfill et al. |
| 6,645,569 B2 | 11/2003 | Cramer et al. |
| 6,653,519 B2 | 11/2003 | Koper et al. |

(Continued)

FOREIGN PATENT DOCUMENTS
EP    1 018 532 A    12/2000
(Continued)

OTHER PUBLICATIONS
International Search Report for PCT/NL06/00344.
(Continued)

*Primary Examiner* — Elena T Lightfoot
(74) *Attorney, Agent, or Firm* — Martin Fleit; Paul D. Bianco; Fleit Gibbons Gutman Bongini & Bianco P.L

(57) ABSTRACT

The invention relates to a method for depositing a polymer layer containing nanoparticles on a substrate material. The method comprises the steps of providing the substrate material, providing a polymerization material near a surface of the substrate material, conducting a gas flow near the surface of the substrate material, the gas flow comprising a nanomaterial, and depositing the polymer layer at the surface of the substrate material by applying a plasma polymerization process.

16 Claims, 6 Drawing Sheets

U.S. PATENT DOCUMENTS

| | | | |
|---|---|---|---|
| 6,723,378 | B2 | 4/2004 | Hrubesh et al. |
| 6,723,388 | B2 | 4/2004 | Svendsen |
| 6,838,816 | B2 | 1/2005 | Su et al. |
| 6,863,933 | B2 | 3/2005 | Cramer et al. |
| 2001/0004473 | A1 | 6/2001 | Strutt et al. |
| 2003/0148139 | A1 | 8/2003 | Moser |
| 2004/0022945 | A1* | 2/2004 | Goodwin et al. ........ 427/255.27 |
| 2004/0194223 | A1 | 10/2004 | Cernack |
| 2004/0258975 | A1* | 12/2004 | Extrand et al. ................... 429/34 |
| 2005/0118427 | A1 | 6/2005 | Linden et al. |
| 2008/0118734 | A1* | 5/2008 | Goodwin et al. ............. 428/221 |

FOREIGN PATENT DOCUMENTS

| | | |
|---|---|---|
| EP | 1134302 | 9/2001 |
| EP | 1387901 | 10/2007 |
| WO | WO 01/06054 | 1/2001 |
| WO | WO 02/05969 | 1/2002 |
| WO | WO 02/095115 | 11/2002 |
| WO | WO 02/102903 | 12/2002 |
| WO | WO 03/066933 | 8/2003 |
| WO | WO 2004/072321 A | 2/2004 |
| WO | WO 2005/110626 A | 5/2005 |

OTHER PUBLICATIONS

International Prelim Report on Patentability for PCT/NL06/00344.
Written Opinion for PCT/NL06/00344.
International Search Report for PCT/NL06/00344, Jan. 18, 2007.
International Prelim Report on Patentability for PCT/NL06/00344, Jan. 10, 2008.
Written Opinion for PCT/NL06/00344, Jan. 8, 2008.

* cited by examiner

METHOD FOR DEPOSITING A POLYMER LAYER CONTAINING NANOMATERIAL ON A SUBSTRATE MATERIAL AND APPARATUS

BACKGROUND OF THE INVENTION

1. Field of the Invention

The invention relates to a method for depositing a polymer layer containing nano-material on a substrate material, comprising the steps of providing the substrate material and providing a polymerization material near a surface of the substrate material.

By attaching nanoparticles or depositing a polymer layer containing nanoparticles on a substrate material, such as textile, surface features of the material can be significantly changed, e.g. the performance of textile in terms of stain-resistance improves, without affecting bulk properties of the material. There are several methods already available and used to apply nanoparticles onto a surface of a substrate material. Those methods may be divided basically into wet techniques and dry techniques.

2. Prior Art

A typical representative of wet techniques is a sol-gel technique. It is a versatile solution process that is suitable to make nanocoatings and polymer matrix composites with nanoparticles. The starting materials used in the preparation of the 'sol' are usually inorganic metal salts or metal organic compounds such as metal alkoxides. To create solid 'gel' on a surface, coating methods such as dip and spin coatings are used. Preparation of hybrid materials that incorporate inorganic systems, such as nanoparticles, into an organic polymeric matrix by sol-gel, or by the incorporation of metals and metal complexes in polymers by coordination interactions, is reviewed by G. Kickelbick (Prog. Polym. Sci. 28, 2003, pp. 83-114). Disadvantages of the techniques, besides those associated with wet processing, are that they require complicated procedures and multi-step processing and a limited sort of nanoparticles may be deposited by these techniques.

A self-assembled nanolayer (SAN) technique has been used to incorporate nanoparticles onto charged textile fibers. The technique is based on the effect of electrostatic attraction between a charged substrate fibre and oppositely charged nanoparticles contained in a solution. The deposition process may be well controlled but a multi-step processing is required and a limited sort of nanoparticles may be deposited by this technique.

Other prior art belonging to the group of wet methods is disclosed in patent publications WO 01 06054 A1 and U.S. Pat. No. 6,607,994 B2, which describe how to durably attach nanoparticles to fibers, yarns, fabrics, and/or textiles (webs) and thus impose various and substantially permanent properties to those materials. The term "nanoparticle" is considered rather generally in those two patents, and it covers an agent or a payload surrounded by or contained within a polymeric encapsulator, which includes functional groups for binding or attachment of the nanoparticle to the treated material. The nanoparticle may also comprise a polymeric shell surrounding the agent/payload and a three-dimensional polymeric network entrapping the agent/payload or a reactive surface coating. Alternatively, the surface of the nanoparticle includes functional groups that can bind to a linker molecule, which will in turn bind or attach the nanoparticle to the treated material. The nature and formulation of the polymeric encapsulator allows a controlled release, from zero to prolonged and constant, of the entrapped payload. Various wet processes such as soaking, spraying, dipping, fluid-flow, padding and the like are used to permanently attach nanoparticles to the treated material by its exposure to a solution or dispersion/emulsion of the textile-reactive nanoparticles, optionally also to a catalyst and/or a linker compound, and subsequent drying.

Patent publication U.S. Pat. No. 6,723,378 B2 discloses a way how to achieve water repellency, fire-retardancy and/or thermal insulation of fibers and fabrics produced from fibers by filling void spaces in the fibers and/or fabrics with a finely divided powdered material, including nanopowder with particles in the size range of 1-500 nm. Sufficiently finely divided powder attach to the fabric's fibers and resist the tendency to be removed from the fabric. Void spaces are filled in by powdered material by filling the voids with a solution that precipitates particles as it dries, by filling the voids with a solution containing a colloidal suspension of particles that remains when the liquid dries, by passing the powder over fibers or forcing the powder to enter the space using various methods. The main disadvantage of this approach for example for the treatment of military clothing or for the protective clothing against chemical and biological agents is that only limited amount of nanoparticles may be attached to the fibers. Further, only very small particles will durably attach to the fibers.

An example of another work based on a wet technique is disclosed in two patent publications, viz. U.S. Pat. No. 6,645,569 B2 and U.S. Pat. No. 6,863,933 B2. In patent publication U.S. Pat. No. 6,645,569 B2 is described a method of applying nanoparticles to a surface, preferably to a soft surface by inject printing and, generally, by any suitable printing technology. Other wet ways of applying nanoparticles to a surface are also mentioned, such as spraying and a dipping and/or soaking process, and such as applying a coating composition containing nanoparticles during a washing or rinsing processes. Plasma treatment is mentioned in claim 7 of the publication but just as one of methods that can be used for a surface energy treatment before using a wet technique for the application of nanoparticles to the said surface. The purpose of the surface energy treatment, e.g. plasma treatment, is "to enhance the ability of the surface to receive the coating composition" containg nanoparticles. In patent publication U.S. Pat. No. 6,863,933 B2 is described a method of hydrophylizing materials, but also of producing other surface modifications of all types of soft surfaces and in some cases hard surfaces, by applying a coating composition containing nanoparticles. Wet techniques how to apply nanoparticles to a surface are those already described in U.S. Pat. No. 6,645,569 B2. Plasma treatment and other treatments are mentioned in claim 6 of the publication in connection with the step of increasing the surface energy of a material but again only before the application of nanoparticles to the said surface by some of the listed wet techniques.

Patent publication U.S. Pat. No. 6,838,816 B2 discloses another example of using a traditional wet coating method such as spray, dip coating or spin coating for the deposition of nanoparticles. In this patent, monodispersed colloid light-emitting nanoparticles of oxides, semiconductors and polymers are deposited on a substrate to fabricate a light emitting diode (LED).

Patent publication U.S. Pat. No. 6,723,388 B2 describes the deposition of nanostructured films comprising one or more metals or metal oxides, optionally with embedded nanopores. By nanostructured film is meant a thin film with a nanoscale domain structure or with nanoparticles in the structure. Nanoporous film refers to a thin film with pores having diameters in the nanometer range. The films are deposited in two steps. In the first step, a precursor solution film is applied on a substrate surface by traditional techniques such as spin coating, spraying, dip coating or inking. In the second step, the film is converted into a nanostructured and/or nanoporous film by a low temperature chemical reaction in a suitable atmosphere. The conversion is initiated for example by light of a suitable wavelength, a plasma and electron or ion beams. This approach can be used for various applications for example for which the nanostructure and a high surface area are important, such as the deposition of sensor or catalyst materials or for the deposition of patterned films in microelectronics industry. Main weaknesses of the approach, besides those associated with wet processing, are that the choice of building nanomaterial is limited and the method, as it is disclosed in the patent publication, is focused on the deposition of films comprising one or more metals or metal oxides from precursor formulations containing metal-organic compounds.

Main drawbacks of wet processing, and in particular in textile wet processing industry, are environmental problems due to the use of a whole host of harmful chemicals, vast amounts of water needed and polluted, and high energy costs due to heating, drying and curing processes. Further, the deposition a homogeneous dispersion of nanoparticles is often difficult and the choice in the type of nanoparticles that can be attached to a substrate is limited. Some wet deposition processes are diffucult to scale-up due to the complicated multi-step processing in which some steps, like spin-coating, are not suitable for the on-line treatment.

Main dry deposition techniques of nanostructured thin films and thin films comprising nanoparticles include physical vapour deposition (PVD) or sputtering, chemical vapour deposition (CVD), and a group of so-called impaction techniques.

PVD is a thin film deposition process in the gas phase in which a source material is physically transferred in the vacuum to a substrate without any chemical reactions involved. PVD includes the step of evaporation or sputtering of the source material to be deposited. Sputtering results from the bombardment of a solid target by high energy chemically inert ions extracted from plasma, the bombardment causing ejection of atoms from the target. The vapour then condensates in the case of evaporation, or the ejected atoms are then re-deposited in the case of sputtering on the surface of a substrate to form a thin film. PVD is commonly used to deposit metals. A metal sputtering process or a metal evaporation process in combination with a low pressure plasma polymerization has been used to deposit a polymer layer containing metal nanoparticles (A. Heilmann, Polymer Films with Embedded Metal Nanoparticles, Springer-Verlag Berlin Heidelberg 2003, ISBN 3-540-43151-9). Problem of this approach for many practical applications, e.g. for applications in the textile industry processing, is that both the metal sputtering process and the metal evaporation process require a high vacuum operation and is essentially limited to metal type nanoparticles in the polymer layer.

There are two main types of CVD processes: thermal CVD and plasma enhanced CVD (PECVD). Deposited species are formed as a result of chemical reactions taking place at elevated temperatures in thermal CVD. Gaseous reactants chemically react in the vicinity of a substrate and a solid product of the reactions is deposited on the substrate surface. In PECVD, a non-thermal plasma is used to generate the desired chemical reactions. As a result, deposition using the same source gases is taking place at lower substrate temperature in PECVD then in thermal CVD.

Patent publication WO 03 066933 A1 discloses a method for depositing hybrid organic-inorganic coatings to a substrate by the use of PECVD at reduced pressure. According to the patent publication, the inorganic component may also comprise nanoparticles, which are homogeneously distributed in the deposited organic component. Both organic and inorganic components, including nanoparticles, are formed through the dissociation of precursors in plasma. A limitation of the disclosed method is that only inorganic nanoparticles may be deposited in an organic component. Further, as nanoparticles are created in the plasma process, characteristics of the deposited hybrid coating, such as size and size distribution of nanoparticles, their surface density, uniformity and homogeneity are not easy to control. Last but not least, the disclosed system operates at reduced pressure and is suitable for the treatment of relatively small substrates and batch processing. It is not fitted for a continuous line operation, which is the must for many processing such as in the textile industry.

Impaction techniques allow depositing fine-grained deposits and coatings with a nanoscale domain structure but they are not convenient for depositing individual nanoparticles. Impaction techniques include for example hypersonic plasma particle deposition (HPPD), gas jet deposition (GJD) and focused particle beam deposition (FPBD). A thermal spray process may also be included in the category of impaction techniques. The impaction techniques are based on the deposition and attachment of nanoparticles to form nanostructured coatings by impaction. It means that nanoparticles are attached to a substrate by their acceleration and high-speed impaction on the substrate surface.

FPBD is described and overview of literature related to other impaction techniques is summarized in patent publication WO 02 05969 A3. Nanoparticles in FPBD are generated in gas phase for example in a DC torch, a thermal plasma reactor, an evaporation-condensation reactor or by laser pyrolysis. They are accelerated in a low pressure (below 10 torr) expansion chamber, collimated by a system of focusing elements and deposited by the impaction on a substrate that is placed in an evacuated deposition chamber with pressure in the order of 0.01 torr and below.

Impaction-based techniques are in general suitable for the deposition on hard surfaces and not on soft and heat sensitive materials such as for example textile. Further, the approach is not convenient for applications that require deposits of individual nanoparticles with well-controlled size, size distribution, surface density and uniformity. The approach is not suitable for the deposition of nanoparticles on inner surfaces of a structured material, e.g. on individual fibers of a textile material, and only a limited sort of nanoparticles may be deposited.

A thermal spray process uses a device to molten or heat-softened a coating material, which is then accelerated and propelled at a high velocity towards a substrate. The hot material impacts on the substrate surface and rapidly cools forming a coating there. Patent publications U.S. 2001 0004473 A1, U.S. Pat. No. 6,277,448 B2 and EP 1 134 302 A1 describe the deposition of a high quality nanostructured coating when the source of coating material is a nanoparticle powder delivered from outside or nanoparticles formed from a precursor directly in the thermal spray device. Patent publication WO 02 102903 A2 discloses synthesis and deposition of luminescent films from a liquid precursor mixture also utilizing a plasma spraying deposition technique. The deposits are composed of randomly oriented nano- to micron-sized grains.

Patent publication U.S. Pat. No. 6,235,351 B1 discloses the application of a coating of nanoparticles on surfaces such as "building exteriors, ship decks and exposed hull portions, aircraft wings and fuselages". The purpose of coating is to create a self-decontaminating surface against chemical and biological contaminants. The coating is achieved by a thermal spray surface deposition in which nanoparticles in an alcohol suspension are fed into a plasma spray gun and are heated there to a temperature of at least 750° C. and are projected on a treated surface on which they splatter and solidify.

Similar to previously mentioned impaction techniques, thermal spray process is not applicable for the deposits of individual nanoparticles in uniform and homogeneous way and for the treatment of soft and heat sensitive surfaces and materials such as textile. Also, the choice of nanoparticles that may be applied is limited due to the high processing temperature.

In the U.S. Pat. No. 6,616,987 is disclosed a process for manipulating particles in a plasma in order to achieve their non-uniform spatial distribution in the plasma and for arranging and adhering at least a portion of those particles on a substrate. However, the process requires low pressure operation and is focused on achieving a non-uniform distribution of nanocrystalline semiconductor particles both in plasma and in the coating, which is a semiconductor layer.

SUMMARY OF THE INVENTION

It is an object of the invention to provide a method for depositing a polymer layer containing nanomaterial on a substrate material, wherein the disadvantages identified above are reduced. In particular, the invention aims at obtaining a method for depositing a polymer layer containing nanomaterial on a substrate material, wherein other, e.g. non-metal nanomaterial can be used. Thereto the method according to the invention comprises the steps of providing the substrate material, providing a polymerization material near a surface of the substrate material, conducting a flow near the surface of the substrate material, the flow comprising a nanomaterial, and depositing the polymer layer containing nanomaterial on the surface of the substrate material by applying a plasma polymerization process.

By conducting a flow near the surface of the substrate material, wherein the flow comprises a nanomaterial, virtually any type of nanomaterial, also non-metal types of nanomaterial, can be embedded in the polymer layer, e.g. organic material. This is due to the feature that not only metal-type particles, but virtually any nanomaterial can be provided in a flow.

The method according to the invention offers an alternative to the wet processing of how to deposit polymer layers with virtually any nanomaterial, the so-called plasma polymerization technique. Polymers formed by the plasma polymerization can have different, and for many applications superior, chemical and physical properties compared to polymers formed by a conventional polymerization.

According to the method, virtually any nano- and microsize material of organic, inorganic and organic-inorganic composition, can be deposited by the technique of plasma polymerization. Nanomaterial is attached to a surface of treated material due to a polymer layer deposited in the process of plasma polymerization on the said surface. The nanomaterial-containing polymer layer derives its functionality from the characteristics of both the nanomaterial and the polymer layer. The strength of invented method is the unique combination of advantages of non-thermal, atmospheric pressure plasma processing and the fact that nanomaterial is delivered from outside (externally) to the reaction space. Further, the disclosed method and apparatus are scalable and suited for the continuous on-line operation.

The method allows the superior control of the nanomaterial deposit, such as the surface density of nanomaterial, its uniformity and homogeneity. Further, because the nanomaterial is not created in the plasma process but is delivered to the reaction space from outside (externally), the method allows choosing nanomaterial with desired characteristics, such as size and size distribution, allowing thus an excellent control over the characteristics of the deposited nanomaterial.

The subject of invention may be used in combination with various plasma sources. However, the preferred embodiment uses the so-called dielectric barrier discharges (DBDs). Thus, preferable plasma sources are plasma electrode structures comprising two electrodes arranged on opposite sides of a dielectric (known as surface DBD), or embedded in a dielectric (known as coplanar DBD). With those plasma sources and in the case of treated materials consisting of fibers, such as various textile materials, nanomaterial is deposited around individual fibers that are on the surface but also in the volume of the material. The consequence is that an enormous surface area may be covered by nanomaterial. Further, voids between fibers are not filled and the fabric keeps its breathability.

Enhancement of performance of a treated material is achieved due to a combined effect of the deposited nanomaterial and properties of the polymer layer itself. Polymers formed by the process of plasma polymerization can have different chemical and physical properties from those formed by conventional polymerization. Plasma polymerized films are, in general, highly cross-linked and, therefore, have many appealing characteristics such as thermal stability, chemical inertness, mechanical toughness and a negligible effect of ageing.

In the plasma polymerization process, advantageously no liquid baths comprising toxic or harmful chemicals are required in contrast to wet techniques. Further, no heating, drying and/or curing activities are needed, thereby reducing operational costs.

The plasma polymerization process is also known as plasma assisted or plasma enhanced or plasma chemical vapour deposition.

The plasma polymerization process can advantageously be performed under substantially atmospheric pressure, thereby reducing costs for providing low pressure circumstances at the locus of depositing the polymer layer, as is required in the case of metal sputtering or metal evaporation techniques for the incorporation of metal nanoparticles.

The method according to the invention is not limited to atmospheric pressure plasma techniques and surface DBD and coplanar DBD plasma sources. Other plasma sources and techniques at atmospheric and/or low pressure can be applied. A non-exhaustive list includes for example APGD (atmospheric pressure glow discharge), volume DBD, microwaves discharge, micro-hollow cathode discharge or plasma jet source. The plasma jet source is particularly suitable for treating three-dimensional and/or non-flat substrate materials.

Dielectric barrier discharges have been used for a long time for various applications such as the control of automotive exhaust gases, ozone generation, sterilization of surfaces, deposition of coatings, and a surface treatment of wood, metals, plastic foils and textiles.

Patent publication U.S. Pat. No. 5,792,517 discloses the ability of a dielectric barrier discharge to form a plasma in the inner voids of a porous non-conductor, which is placed between the electrodes, allowing thus to treat not only outer but also inner surfaces of the porous non-conductor. An example from the patent mentions a plasma treatment of surfaces of the inner spaces formed by constitutional fibres of a fabric porous article. Types of plasma treatments covered by the patent publication includes a chemical modification of outer-inner surfaces of a porous non-conductor, such as an introduction of desired functional groups into the chemical compounds on the said surfaces (so-called plasma activation), and a physical modification of the outer-inner surfaces, such as a roughening finishing.

One type of DBD, known as surface DBD, is very suitable for the treatment of surfaces and for the treatment of textile materials in particular. The reason is that discharge channels filled with plasma are parallel with a treated surface and plasma is thus in a good contact with the said surface. Another reason is that not only outer surfaces but again also inner surfaces of woven and non-woven textiles are treated by plasma.

The use of a surface DBD electrode configuration for the textile treatment, including the inner textile surface, is described e.g. in the work of M. Cernak et al. (Proc. $17^{th}$ Symp. On Plasma Processing, Nagasaki 2000, pp. 535-538; Abstracts of $7^{th}$ Int. Conf. on Plasma Surface Engineering, Garmisch-Partenkirchen 2000, p. 86) and a paper by J. Rahel, et al., Czech. J. Phys. 50, 2000, Suppl. S3, pp. 445-448. The application of a coplanar DBD "for treating textile materials said surface treatment of fibres and woven and nonwoven textile materials that are situated inside of the textile materials or on the surface of the textile materials" is presented in patent publication WO 02/095115 A1 (also published in U.S. 2004 194223 A1 and EP 1 387 901 A1). The coplanar DBD is a special case of surface DBD in which metallic parts of electrodes are embedded in a dielectric and are not in direct contact with plasma, resulting thus in a longer lifetime of electrodes. The main idea of patent publication WO 02/095115 A1, i.e. a simultaneous plasma treatment of both outer and inner surfaces of a textile material, thus repeat what was already dislosed in U.S. Pat. No. 5,792,517 and prior-the-patent references by Cernak and Rahel mentioned above. However, while using the surface DBD and a coplanar DBD plasma sources is particularly convenient for the treatment of soft and porous surfaces such as textile, the work presented in the above cited sources is neither about the deposition nor about nanoparticles.

Plasma polymerization used for the deposition of thin polymer layers is a well-known technique. As prior art, we would like to refer to a plasma polymerization process developed by the Defence Science and Technology Laboratory (Dstl), the UK Ministry of Defence's research organisation, and commercialised by Porton Plasma Innovations (P2i) Ltd. The plasma polymerization process is used to cover fibres of a material by a thin polymer layer creating thus a chemically tailored surface for various applications. An example is a polymer coating on protective clothing against various chemical agents, or a bio-compatible coating on medical components. Based on the available information, the deposition process is conducted at reduced pressure in a plasma chamber that allows just batch processing.

In the method according to invention, preferably, the flow comprises a material in which a discharge is generated and which also serves as a carrier for carrying a nanomaterial and a polymerization material. The flow material comprises a gas or a mixture of gases. However, it is also possible to use other materials, such as a gasified liquid, a liquid, an atomized (sublimated) solid.

The polymerization material can be a gas or other materials, such as a gasified liquid, a liquid, and an atomized (sublimated) solid, and it can comprises any material, such as a monomer, a dimer, a trimer, a copolymer, etcetera, which can create a polymer in plasma.

It is noted that with the term "polymer layer" also a polymer-like layer has to be understood.

By the term "nanomaterial" is meant particles and in general any structure with the size in nanometer and micrometer range. Those structures include nanofibers and/or nanotubes or combination of them, such as nanotubes with attached and/or embedded nanoparticles and/or nanoparticles with encapsuled one or more elements, such as drug, dye and/or fragrance. Further, the nanomaterial can comprise either one type of nanomaterial or a mixture of nanomaterials. Preferably, the nanomaterial comprises a metal and/or a metal oxide in order to result in specific enhanced features of the substrate material. Instead of using metals and/or metal oxides, other organic, inorganic nano-material or inorganic-organic systems could be used.

By the term "surface" are meant outer surfaces of a treated material but also the surface of fibers, which eventually comprise the treated material, that are located on the outer surfaces of the material but also inside the material. The term "surface" also includes inner surfaces of a fiber with a porous structure. In some embodiments the surface may comprise just one fiber or more fibers, which do not form a web but for example a cord, by which is understood a long slender flexible material usually consisting of several strands (as of thread or yarn) woven or twisted together. The term "surface" also include inner surface of a pore of porous membrane.

By the term "fiber" is meant a unit of matter, either natural, such as cotton, synthetic (man-made), such as polyester, or combination of thereof, which forms the basic element of, for example, fabrics and textile structures. A fiber itself may have a porous structure with voids.

The term "coating" includes coatings that completely cover a surface or just a portion of a surface.

By the term "plasma" is meant a partially ionized gas that represents chemically active environment, which consists of activated species such as electrons, ions, radicals, metastables and photons.

Further, by "plasma polymerization" is meant the procedure, in which polymerizable materials, stimulated through a plasma, condense as polymers.

Preferably, the polymerization material is mixed with the nanomaterial in the flow. Thereby, providing the polymerization material and nanomaterial near a surface of the substrate material is further simplified. The ratio of polymerization material with respect to nanomaterial can relatively easily be monitored and controlled, while a substantially homogenous deposition layer can be obtained in combination with a good control over the surface density and uniformity of the deposited nanomaterial. Further, the polymerization material can serve as the carrier material for carrying the nanomaterial. Alternatively, the nanomaterial can be brought near the surface of the substrate material before and/or during the plasma process or even after performing individual plasma polymerization procedures.

To provide the flow comprising the nanomaterial, an injection system can be employed for injecting the nanomaterial into the flow. Otherwise, the nanomaterial might be blended in a dispersion of a liquid precursor. Further, the nanomaterial is mixed with a gaseous precursor. Optionally, the flow is conducted over or through dry nanomaterial or its dispersion.

In a specific embodiment, the substrate material comprises woven and/or non-woven textile materials. Other substrate materials comprise both soft and/or hard surfaces, among others paper, leather, any sort of foil, membrane, ceramic, etcetera.

Further, the invention relates to an apparatus for depositing a polymer layer containing nanomaterial on a substrate material.

Other advantageous embodiments according to the invention are described in the following.

BRIEF DESCRIPTION OF THE DRAWINGS

By way of example only, embodiments of the present invention will now be described with reference to the accompanying figures in which.

The figures are merely schematic views of preferred embodiments according to the invention. In the figures, the same reference numbers refer to equal or corresponding parts.

DETAILED DESCRIPTION OF THE INVENTION

Figure 1:
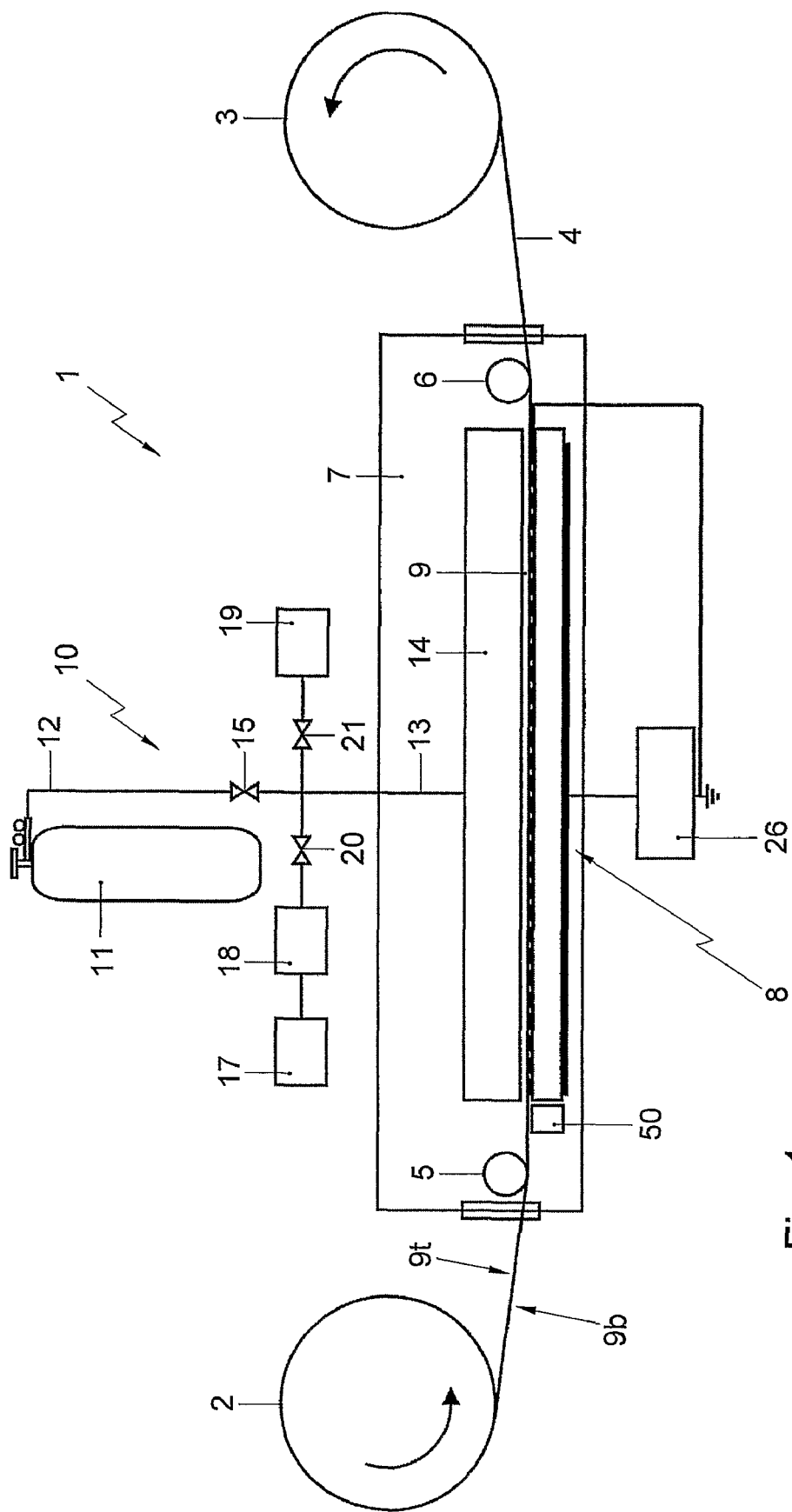
FIG. 1 shows a schematic view of a first embodiment of an apparatus according to the invention.

FIG. 1 shows a schematic view of a first embodiment of an apparatus 1 for depositing a polymer layer containing nanomaterial on a substrate material according to the invention. The apparatus 1 comprises a substrate carrier having a first and a second roller 2, 3 for winding the substrate material which in the shown embodiment is a textile layer 4 comprising fibers of woven and/or non-woven textile material. The textile layer 4 between the two rollers 2, 3 is guided by means of a first and a second guiding roller 5, 6 in an atmospheric pressure plasma chamber 7. The plasma is generated by means of an electrode structure 8 having a substantially flat boundary plane 23, which is arranged near a bottom surface 9b of the textile layer 4 to be treated. The plasma electrode structure 8 will be described in more detail with reference to FIGS. 2-5.

The apparatus 1 further comprises a transport structure 10 for providing a polymerization material near the top surface 9t and/or bottom surface 9b of the textile 4 to be treated, as well as for conducting a flow near the surface 9t of the textile 4, the flow comprising a nanomaterial. The transport structure 10 comprises a carrier gas tank 11, e.g. a gas bottle, a pipe segment 12, a feed line 13 and an outlet port 14. The carrier gas tank 11 is connected with the pipe segment 12 to generate a flow in the feed line 13. The feed line 13 is interconnected with the pipe segment 12 via a connection module or valve 15. The end of the feed line 13 is mounted on the outlet port 14 so that during use the flow streams through an upper opening in the outlet port 14. The outlet port 14 is arranged opposite to the plasma electrode structure 8 so that it faces the top textile surface 9t to be treated. As will be explained in more detail with reference to FIGS. 6 and 7, the outlet port 14 is provided with openings to provide the flow near the top surface 9t of the textile 4. As a consequence, the textile 4 to be treated is substantially located between the outlet port 14 and the substantially flat boundary plane 23 of the plasma electrode structure 8.

It is noted that the polymerization material can also be provided by means of a gasified liquid precursor or a sublimated solid precursor, instead of the gaseous precursor according to the shown embodiment.

As indicated, the transport structure 10 is further arranged to conduct a flow comprising nanomaterial towards the top surface 9t of the textile 4 through a valve 20, the feed line 13 and the outlet port 14. The transport structure 10 comprises a vessel 17 with a liquid polymerization material (precursor) connected with a liquid gasifier 18 which is connectable with the feed line 13 by means of the valve 20. Further, the transport structure 10 comprises a vessel 19 with a gaseous polymerization material (precursor) which is connectable with the feed line 13, via a second valve 21. It is noted that the polymerization material can also be provided by means of a sublimated solid precursor, instead of the gaseous precursor or a gasified liquid precursor according to the shown embodiment. Nanomaterial is supplied in the form of a dispersion in the liquid precursor in the vessel 17 and/or in the form of a dry powder that is mixed with the gaseous precursor in the vessel 19 and/or is injected directly into the flow in the feed line 13, after the valves 15, 20 and 21.

By opening at least one of the first or second valve 20, 21 or by injecting a dry nanomaterial directly into the feed line 13, the flow comprising a carrier gas, a polymerization material and a nanomaterial reaches the top surface 9t of the textile 4 via the outlet port 14. Optionally, the feed line 13 may be split up and also feed a second outlet port 50 which is placed in the plasma chamber 7 below the treated textile 4 and before the electrode 8. By the outlet port 50, the flow reaches the bottom surface 9b of the textile 4.

Hence, the flow arriving at the surface of the textile 4 via the outlet port 14 and/or 50 comprises a carrier gas, a precursor and the nanomaterial. The carrier gas is the main gas that flows from the gas tank 11 and in which the discharge is generated and may comprise any gas or a mixture of gases. The precursor is a polymerization material, which is the building material for the polymer layer and may be supplied directly as a gas, as a liquid (which is gasified) or potentially as a solid (which is turned into gas by sublimation). Optionally, a mixture of several carrier gases and several precursors may be used. The gas(es), precursor(s) and nanomaterial(s) can be delivered in various ways. The following four embodiments are given to illustrate some examples. The embodiments are not exhaustive.

In a first embodiment a carrier gas is delivered from the tank 11. Nanomaterial is mixed with a liquid precursor in the vessel 17, the mixture of the nanomaterial and precursor go through the gasifier 18, valve 20 and is mixed with the carrier gas in the feed line 13.

In a second embodiment a carrier gas is delivered from the tank 11. Nanomaterial is mixed with a gaseous precursor in the vessel 19 and the mixture of the nanomaterial and precursor goes through the valve 21 and is mixed with the carrier gas in the feed line 13.

In a third embodiment a carrier gas from the tank 11 and a gasified liquid precursor from the vessel 17 are delivered into the feed line via the valves 15 and 20, respectively. Nanomaterial is injected directly into the flow in the feed line 13, after the valves 15, 20 and 21.

In a fourth embodiment a carrier gas from the tank 11 and a gaseous precursor from the vessel 19 are delivered into the feed line via the valves 15 and 21, respectively. Nanomaterial is injected directly into the flow in the feed line 13, after the valves 15, 20 and 21.

The nanomaterial may comprise metal oxide nanoparticles, such as titanium dioxide ($TiO_2$) to impart UV absorption, an opalescent effect and/or photo catalytic activity for providing e.g. antifouling benefits, a flame retardant surface and/or a support layer in a dye solar cell. Other metal oxide nanoparticles include for example magnesium oxide (MgO) for providing a self-sterilizing function and zinc oxide (ZnO) for providing UV shielding and reducing static electricity. Further, the chemical activity of for example $TiO_2$ and MgO nanoparticles can be used to protect against biological and chemical agents. Instead of metal oxide nanoparticles, the method according to the invention is suitable for using any nanomaterial, both organic and inorganic and organic-inorganic, and including not only nanoparticles but, for example, also nanotubes may be deposited in a polymer layer.

It is noted that a combined functionality of polymer layer and of embedded nanomaterial or of several types of nanomaterials may be beneficial for the simultaneous protection against a variety of chemical and biological agents.

Depending on the choice of nanomaterial, a self-decontaminating coatings and/or coatings providing permanent protection may be achieved, e.g. in the case of applying metal oxide nanoparticles.

By the application of another type of nanomaterial, such as functionalized carbon nanotubes, a sensor-like coating may be deposited.

By the employment of the method according to the invention, the characteristics of the deposited nanomaterial, e.g. its size and size distribution, and its deposit, e.g. surface density, uniformity and homogeneity, may be better controlled. Homogeneous deposition of small-size nanoparticles with narrow size distribution may be beneficial for the efficiency of decontamination.

When using surface dielectric barrier discharge electrodes to generate plasma, nanomaterial is deposited not only on the surface of substrate (fabric) but also around individual fibers located inside the treated fabric. This feature is particularly important when nanoparticle-containing coatings are applied to a fabric that is used for example for the manufacture of protective coatings against chemical and biological agents. The reason is that an enormous surface area is covered by active nanoparticles. Furthermore, the protection is achieved while keeping the fabric breathable.

The capability of specific nanoparticles to destroy dangerous substances such as chemical and biological warfare agents is disclosed in patent publication U.S. Pat. No. 6,653,519 B2 in which the absorbing and/or destruction effects are achieved by simply contacting the target substance with finely divided metal oxide or metal hydroxide nanocrystalline particles with the preferred average size is of up to about 20 nm.

Squeeze coating and electrostatic attachment is reported to attach $TiO_2$ and MgO nanoparticles to a textile to be used as a chemical and biological protective material (S. M. Hartley, H. Axtell, O. B. Koper and K. J. Klabunde, "The next generation of chemical and biological protective materials utilizing reactive nanoparticles"). However, as already mentioned in the prior art, those ways of attaching nanoparticles present numerous disadvantages.

In the method according to the invention, the nanoparticles are embedded in a polymer layer and the performance of air permeable protective clothing is further enhanced due to the polymer layer itself, for example due to the hydrophobicity of the polymer layer.

The method according to the invention is plasma-based and has advantages following from the dry plasma treatment such as environmental friendliness and no need for drying, as indicated above.

Figure 2:
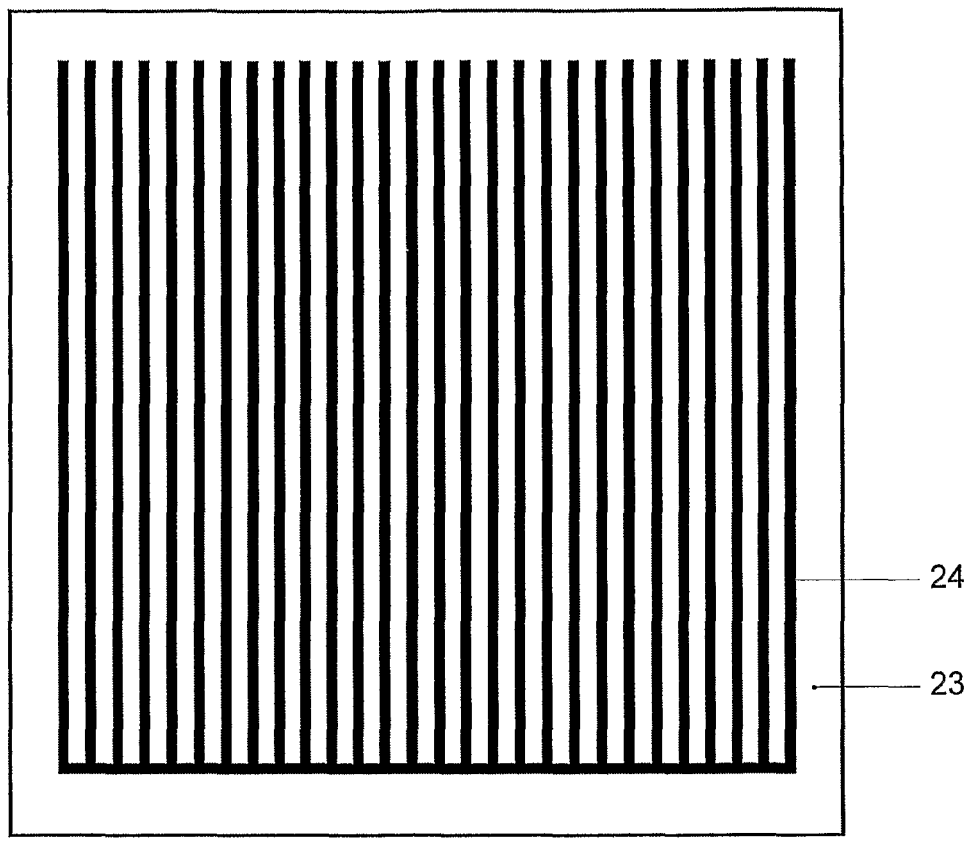
FIG. 2 shows a schematic plan view of a first embodiment of a plasma electrode structure of the invention.
Figure 3:
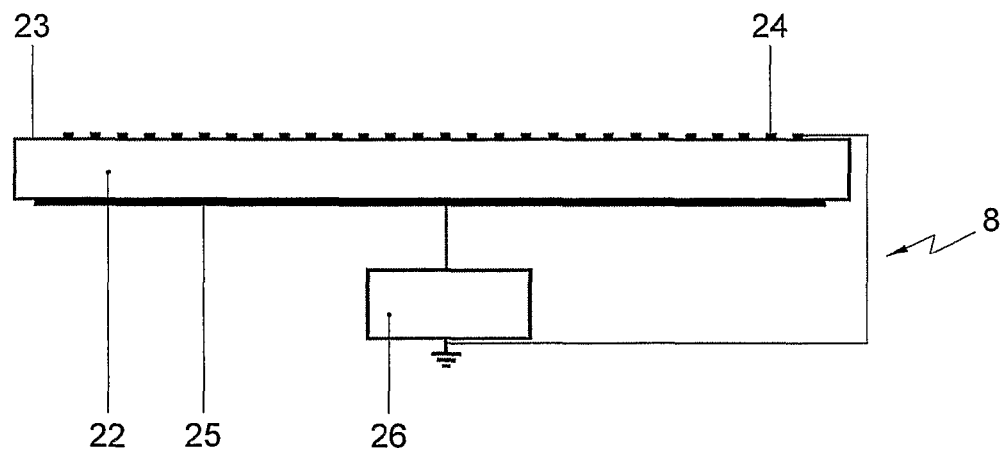
FIG. 3 shows a schematic cross sectional view of the plasma electrode structure of FIG. 2.

FIGS. 2 and 3 show in plan view and in cross sectional view, respectively, an electrode structure 8 according to a first embodiment in more details. The structure 8 comprises a block-shaped dielectric 22 having a substantially flat upper boundary plane 23 facing the bottom surface 9*b* of the textile in the atmospheric pressure plasma chamber 7. On the upper boundary plane 23 a comb-like electrode structure is arranged, forming a first electrode 24, see in particular FIG. 2. On the opposite side, the lower side of the dielectric 22 a second, substantially rectangular-shaped electrode 25 is arranged. The electrodes 24, 25 are connected with output ports of a power source 26. Application of a voltage between the first and second electrode 24, 25 generates a plasma near the first electrode 24. The electrode structure 8 shown in FIGS. 2 and 3 is known as surface DBD (dielectric barrier discharge).

Figure 4:
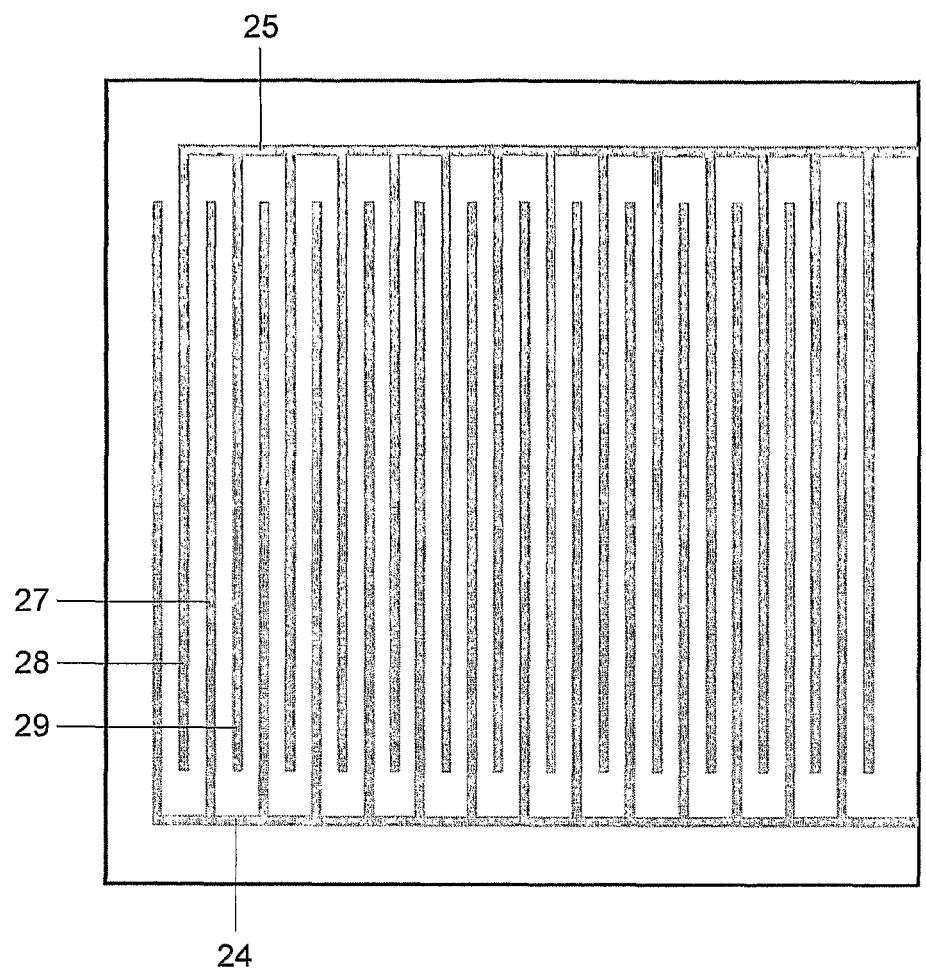
FIG. 4 shows a schematic plan view of a second embodiment of a plasma electrode structure of the invention.
Figure 5:
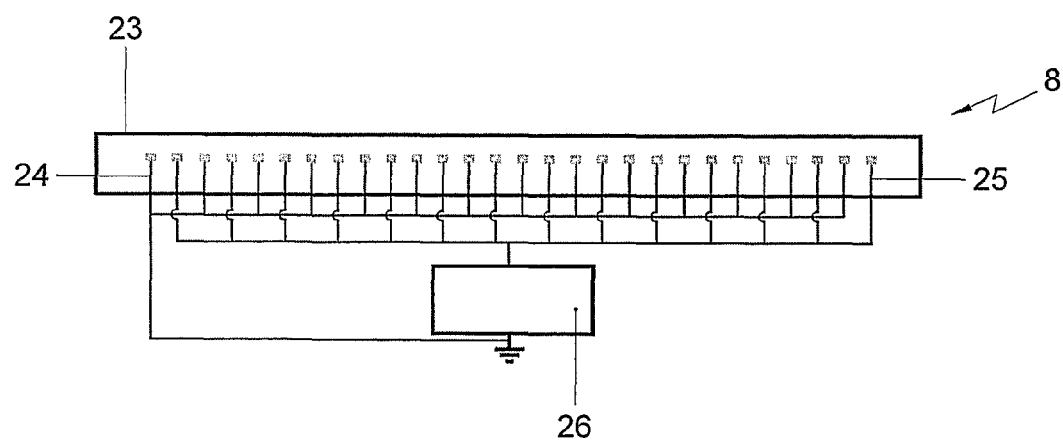
FIG. 5 shows a schematic cross sectional view of the plasma electrode structure of FIG. 4.

FIGS. 4 and 5 show in plan view and in cross sectional view, respectively, a plasma electrode structure 8 according to a second embodiment in more detail. Instead of arranging the first and second electrodes 24, 25 on boundary planes of the dielectric 22, both electrodes 24, 25 are embedded in the dielectric 22, see in particular FIG. 5. Both electrodes have a comb-like structure, wherein at least one extending portion 27 of the first electrode 24 is positioned between two extending portions 28, 29 of the second electrode 25. The second embodiment of the electrode structure 8 is known as coplanar DBD and has a longer lifetime compared with a surface DBD structure since the generated plasma on the substantially flat, upper boundary plane 23 is not in contact with the metallic parts of the electrodes 24, 25.

By performing the process of plasma polymerization while employing the surface DBD or the coplanar DBD electrode structure, a polymer layer containing nanomaterial is deposited on the surface of individual fibres that form the treated fabric and that are situated on both the outer surface of the textile 4 but also inside of the treated fabric.

Figure 6:
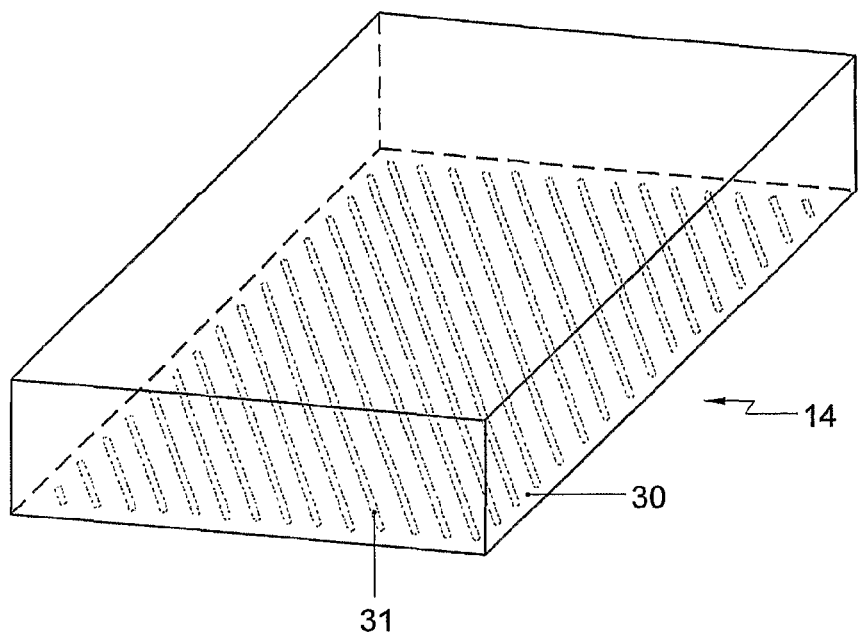
FIG. 6 shows a schematic perspective view of a first embodiment of an outlet port of the apparatus of FIG. 1.
Figure 7:
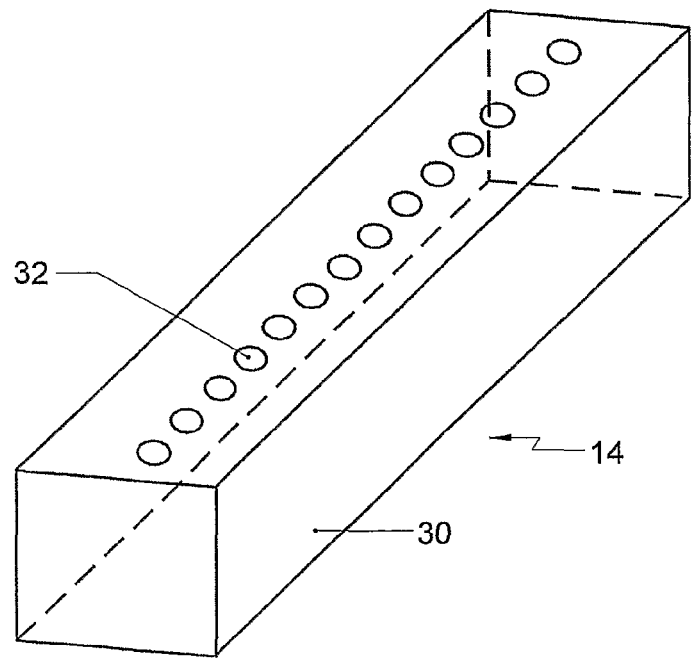
FIG. 7 shows a schematic perspective view of a second embodiment of an outlet port of the apparatus of FIG. 1.

FIGS. 6 and 7 show a schematic perspective view of the outlet ports 14 and 50, respectively. The outlet port 14 comprises a box-shaped structure with an upper opening (not shown) for connection with the feed line 13. The box-shaped structure is provided with openings in the lower plane 30 in order to achieve a substantially homogenous distribution of the mixture of a carrier gas, precursor and the nanomaterial near the top surface 9*t* of the textile 4 to be treated. The openings are implemented for example as substantially parallel oriented slits 31.

The outlet port 50 also comprises a box-shaped structure, which has a side opening (not shown) for connection with the feed line 13. The box-shaped structure is provided for example with evenly distributed round apertures 32 in order to achieve a substantially homogenous distribution of the mixture of a carrier gas, precursor and the nanomaterial near the bottom surface 9*b* of the textile 4 to be treated.

Optionally, another embodiment of the apparatus according to the invention can be arranged in such a way that on one side of the textile 9 to be treated a system of outlet ports 50 and plasma electrode structures 8 are placed in series, so that the textile 9 is subsequently treated by a flow and a plasma process, and vice versa. In FIGS. 8 and 9, examples of such configurations are shown. On the other side of the textile 9 to be treated a series of other outlet ports 14 is arranged for similar treatment of the textile with a flow. During the process, the textile 9 moves in a process direction D.

It is noted that the polymerization material and the nanomaterial can be provided near the surface of the material on which the polymer layer containing nanomaterial is to be deposited, either together or separately, both in time and place. The following embodiments are given to illustrate some examples. The embodiments are not exhaustive.

In a first embodiment the polymerization material and the nanomaterial are provided near the surface simultaneously and on the same place via one feed line 13 and outlet port 14 and/or 50, as described above.

In a second embodiment the polymerization material and the nanomaterial are provided consecutively in time via one single feed line 13 and outlet port 14 and/or 50. The textile material is moved batchwise. The process of providing polymerization material and nanomaterial can be repeated. It is of course also possible to provide the polymerization material via a first outlet port 14a and/or 50a and the nanomaterial via a second outlet port 14b and/or 50b. In the latter case a continuous process can be obtained.

Figure 8:
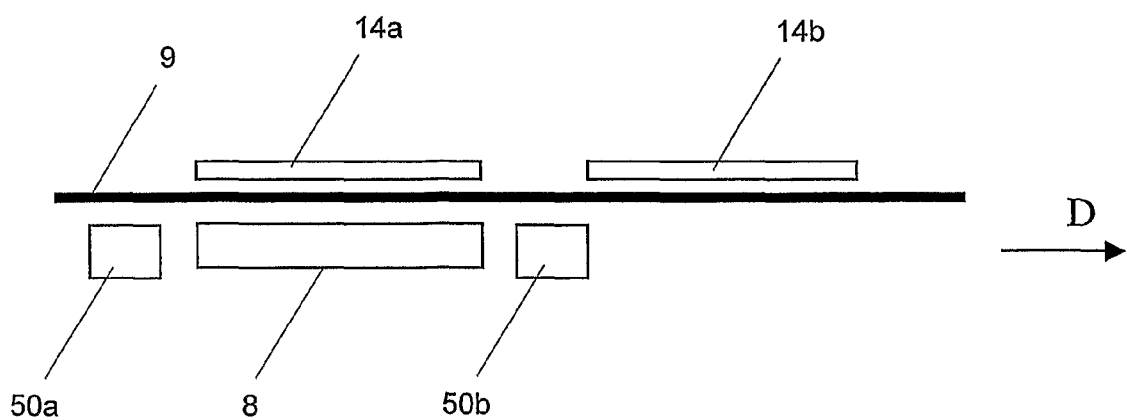
FIG. 8 shows a schematic view of a detail of a second embodiment of the apparatus according to the invention.
Figure 9:
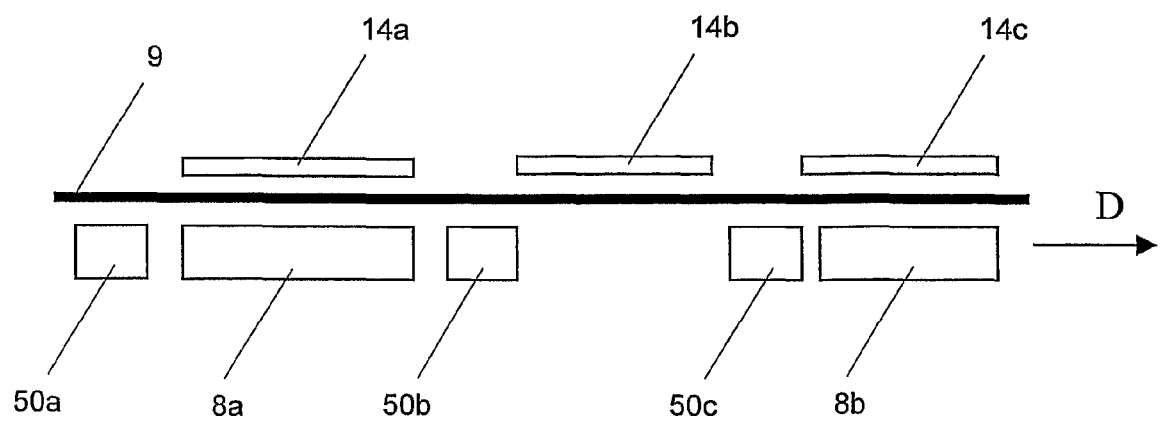
FIG. 9 shows a schematic view of a detail of a third embodiment of the apparatus according to the invention.

In a third embodiment the process is modified to obtain an enhanced plasma polymerization process. By "plasma enhanced polymerization" is meant a polymerization process, which does not occur in a plasma but which takes place after a step of activating a treated surface by a plasma. In this process, the surface to be treated is initially processed by a plasma process to form chemically active sites on the surface. During this process, a carrier gas is blown over the surface via a first upper outlet port 14a and/or a first lower outlet port 50a. Then, polymerization material and nanomaterial are deposited simultaneously at the same place (via a second upper outlet port 14b and a second lower outlet port 50b, see FIG. 8) or at distinct places (the polymerization material via a second upper outlet port 14b and/or a second lower outlet port 50b, and the nanomaterial via a third upper outlet port 14c/or and a third lower outlet port 50c, see FIG. 9) to form the deposited polymer layer. In the latter case, nanomaterial can also be supplied not only via the third outlet ports 14c, 50c, but also via the second outlet ports 14b, 50b. Eventually, the polymerization material may also be delivered together with the nanomaterial via the third outlet ports 14c, 50c. The steps of supplying the polymerization material and the nanomaterial can be repeated if desired. A carrier gas is provided near a substrate material at each step involving a plasma treatment.

The invention is not restricted to the embodiments described herein. It will be understood that many variants are possible. Instead of a surface DBD or coplanar DBD electrode structure, a plasma jet or a microwave source can be applied, especially for depositing a polymer layer containing nanomaterial on a three-dimensional substrate material.

Further, the electrode structure is not necessary substantially planar, but may have any shape, e.g. they can have a curved shape, such as a cylinder or a drum. Also the outlet ports can have various forms, such as cylindrical or drum-shaped forms. In the case of surface DBD the metal tracks 24 could be covered by a protective layer in order, for example, to minimize sputtering. In the case of coplanar DBD electrodes, metal tracks do not need to be embedded in the dielectric at the same level. Further, an additional third electrode can be applied in order, e.g. to reduce ignition voltage. The third electrode can be embedded in the dielectric material, e.g. ceramic, or placed on its surface. Also, an additional ceramic layer can be added to the surface of coplanar DBD electrode element in order to reduce the ignition voltage. Further, an additional electrode can be placed at the bottom of outlet port 14 or over the surface 9 of textile 4 in order, for example, to increase the thickness of the plasma. Two surface DBD or coplanar DBD electrodes can be placed on opposite sides of treated surface 9 in order, for example, to achieve a double-side treatment of a substrate.

Further such variants will be obvious for the man skilled in the art and are considered to lie within the scope of the invention as formulated in the following claims.

The invention claimed is:

1. A method for depositing a polymer coating containing nanomaterial on a substrate comprising the steps of:
   a. establishing a reaction zone;
   b. feeding an elongated substrate having top and bottom surfaces longitudinally and horizontally through the reaction zone;
   c. introducing a conduit into the reaction zone that terminates in an outlet positioned near and across the top surface of the substrate, said outlet having an array of discharge openings extending transversely across the substrate to provide a substantially homogenous distribution of outflow near and across the substrate;
   d. creating a flow of carrier gas that supports a non-thermal plasma and contains a polymerization material in gas state and nanomaterial dispersed therein;
   e. passing the flow through the conduit, outlet and discharge openings to discharge the flow near to the top surface of the substrate and substantially homogenously transversely across the substrate; and
   f. wherein non-thermal plasma processing is generated in said reaction zone to deposit on the substrate a polymer layer containing non-thermally embedded nanomaterial preserved in physical shape.

2. The method of claim 1 wherein the establishment of the reaction zone is accomplished by the step of positioning an electrode structure under the substrate that extends transversely across the substrate and near its bottom surface.

3. The method of claim 2 including the further step of defining a substantially flat boundary plane beneath the substrate by the electrode structure.

4. The method of claim 2 further including the step of creating another flow of carrier gas that supports a non-thermal plasma and contains a polymerization material in gas state and nanomaterial dispersed therein through another outlet having discharge openings to outflow near the bottom surface of the substrate, substantially homogenously transversely across the substrate, said another flow being juxtaposed upstream of the electrode structure.

5. The method of claim 1 wherein the flow of carrier gas is created externally of said reaction zone, by one of (i) a polymerization material in gaseous phase with nanoparticles dispersed therein, and (ii) a polymerization material in gaseous phase and nanoparticles separately introduced into the carrier gas.

6. The method of claim 1 wherein processing is effected by a non-thermal, atmospheric pressure plasma in said reaction zone.

7. The method of claim 1 including the further step of converting liquid polymerization material containing nanoparticles dispersed therein to gaseous state with nanoparticles dispersed therein before creating the flow.

8. The method of claim 1 including the further steps of maintaining a supply of dry nanomaterial, and introducing the dry nanomaterial directly into carrier gas.

9. The method of claim 1 including the further steps of maintaining a supply of a solid polymerization material that can be sublimated, and sublimating the polymerization material to convert to its gaseous state.

10. The method of claim 1 wherein the substrate is a textile material.

11. The method of claim 1 wherein the nanomaterial is selected from the group consisting of metal oxides, organic particles and mixtures thereof.

12. The method of claim 1 wherein the substrate is fed one of intermittently and continuously.

13. The method of claim 1 wherein the flow is introduced via a conduit into the reaction zone that terminates in plural outlets longitudinally spaced and positioned near and across the top surface of the substrate, each said outlet having an array of discharge openings extending transversely across the substrate to provide a substantially homogenous distribution of outflow near and across the substrate.

14. The method of claim 13 wherein plural outlets are longitudinally spaced and positioned near and across the bottom surface of the substrate, each said outlet having an array of discharge openings extending transversely across the substrate to provide a substantially homogenous distribution of outflow near and across the substrate.

15. The method of claim 13 wherein the outflow from each outlet is selected from the group consisting of carrier gas, a polymerization material in gas state and nanomaterial dispersed therein; carrier gas and a polymerization material in gas state; carrier gas and nanomaterial dispersed therein; and carrier gas.

16. The method of claim 14 wherein the outflow from each outlet is selected from the group consisting of carrier gas, a polymerization material in gas state and nanomaterial dispersed therein; carrier gas and a polymerization material in gas state; carrier gas and nanomaterial dispersed therein; and carrier gas.

* * * * *